(12) United States Patent
Liou

(10) Patent No.: US 6,954,376 B2
(45) Date of Patent: Oct. 11, 2005

(54) NON-VOLATILE SEMICONDUCTOR MEMORY ARRAY STRUCTURE AND OPERATIONS

(75) Inventor: Jhyy-Cheng Liou, Jhubei (TW)

(73) Assignee: Solid State System Co., Ltd., Hsinchu (TW)

( * ) Notice: Subject to any disclaimer, the term of this patent is extended or adjusted under 35 U.S.C. 154(b) by 108 days.

(21) Appl. No.: 10/737,413

(22) Filed: Dec. 15, 2003

(65) Prior Publication Data
US 2005/0128806 A1 Jun. 16, 2005

(51) Int. Cl.$^7$ ............................ G11C 16/04; G11C 5/02; G11C 5/06
(52) U.S. Cl. ............................ 365/185.05; 365/185.17; 365/51; 365/63; 365/72
(58) Field of Search ........................ 365/185.05, 185.16, 365/185.17, 51, 63, 72

(56) References Cited
U.S. PATENT DOCUMENTS 5,303,184 A * 4/1994 Noda .................... 365/185.16
5,557,569 A * 9/1996 Smayling et al. ......... 365/185.28
6,008,516 A * 12/1999 Mehrad et al. .............. 257/315
2004/0071011 A1 * 4/2004 Nishizaka et al. .......... 365/154

* cited by examiner

Primary Examiner—Anh Phung
Assistant Examiner—J. H. Hur
(74) Attorney, Agent, or Firm—J.C. Patents

(57) ABSTRACT

A non-volatile memory array structure, comprising a plurality of first transistors, serving for memory function, being arranged to have a plurality of columns and a plurality of first rows. The first transistors in each column are coupled in series, and adjacent two of the columns are grouped into a memory group using a common bit line. The gate electrodes of the first transistors in the same first row are coupled with a first sequence word line. A plurality of second transistors are also included. Each of the second transistors is coupled between two columns of the memory group and is adjacent to each of the first rows. The second transistors form a plurality of second rows, wherein gate electrodes of the second transistors in the same second row are coupled to a second sequence word line.

21 Claims, 8 Drawing Sheets

NON-VOLATILE SEMICONDUCTOR MEMORY ARRAY STRUCTURE AND OPERATIONS

BACKGROUND OF THE INVENTION

1. Field of Invention

The present invention relates to non-volatile memory. More particularly, the present invention relates to non-volatile memory with horizontal memory cells and vertical memory cells.

2. Description of Related Art

Non-volatile memory has its wide applications in various field, such as the multimedia or particularly to the portable multi-media applications including digital camera and audio player, or the smart cellular phone. All of these apparatus need to store data or contents when power is off. Non-volatile memory then has various applications.

Basically, the Non-volatile memory device includes multiple memory cells arranged in an array manner. Usually, one memory cells can store a binary data. Conventionally, the memory cell, such as volatile memory of DRAM, is formed by a metal-oxide semiconductor (MOS) transistor with a capacitor, wherein the capacitor is used to store the data. However, for the non-volatile memory, such as PROM or EPROM, the memory cell structures include floating gate and control gate, wherein the floating gate is used to store the binary data. When the memory cell size has been greatly reduced, a memory cell with oxide-nitride-oxide (ONO) structure has also been proposed.

FIG. 1 is a cross-sectional drawing, schematically illustrating a conventional MOS memory cell with the ONO structure to have memory function. In FIG. 1, a semiconductor substrate 100, such as a P-type silicon substrate, is provided. A gate structure stack is formed on the substrate 100, and the doped regions 110, such as N+ doped region, are formed in the substrate at each side of the gate structure stack. The gate structure stack includes a tunnel oxide layer 108, a trapping layer 106 and a control oxide layer 104, which are sequentially formed on the substrate 100. Then, a gate layer, such as a polysilicon layer 102, serving as a control gate, formed on the control oxide layer 104. The photolithographic and etching processes are performed to pattern the stacked layer, so as to form the gate structure stack.

For this memory cell structure in FIG. 1, during a writing process for example, a proper voltage is applied on the control gate 102, then the electrons tunneling from the tunnel oxide layer 108 and are trapped in the trapping layer 106 to store a binary data. A control oxide 104 is located between the trapping layer 106 and a control gate electrode 102. Taking the N-type MOS memory cell as an example, the substrate 100 is a P-type well. The doped region 110 is the N+ region. Basically, the layers 104, 106, and 108 form a structure of oxide/nitride/oxide (ONO) layer with memory function. The mechanism of Fowler-Nordheim (FN) Tunneling effect is employed for programming the memory cell. By applying proper voltages on the gate electrode, source region, drain region, and the substrate, electrons can be injected into or driven out from the trapping layer 106, so as to achieve the programming and erasing function. In reading process, depending on the status of electrons stored in the trapping layer 106, the binary data can be read. In other words, the cell $V_T$ (threshold voltage) could be programmed to high $V_T$ by F-N mechanism, due to electrons being trapped in the thin dielectric layer, and cell can be erased to low $V_T$ by F-N mechanism, due to electrons being de-trapped from the thin dielectric layer. So the cell device can perform the storage function for non-volatile memory. The mechanism is known by the ordinary skilled artisans and is not described in better detail.

By using the memory cell in FIG. 1, a memory array device, such as a NOR type flash memory, is conventionally proposed as shown in FIG. 2. In FIG. 2, the memory array structure is composed by memory cells 200. Each cell 200 has it's own word line WL, bit line BL and source ground. It can be selected and deselected through the control on the word line and bit line.

Another conventional memory array device is shown in FIG. 3. In FIG. 3, The NAND flash memory design has more compact cell array structure, comparing with NOR type flash. The memory cells 300 are connected in series manner. The bit line BL and the source line are common in the same diffusion region. The bit line area and source area are shared with the previous cell and next cell. In this manner, the cell pitch is more compact, so that it is suitable for data storage with low cost per bit.

It still has several types of conventional flash memory, such as AND type, DINOR type. However, a novel type of flash memory with better compact or better operation algorithm is still desired by the manufactures.

SUMMARY OF THE INVENTION

The invention provides a non-volatile memory array structure, comprising a plurality of first transistors, serving for memory function, being arranged to have a plurality of columns and a plurality of first rows. The first transistors in each column are coupled in series, and adjacent two of the columns are grouped into a memory group using a common bit line. The gate electrodes of the first transistors in the same first row are coupled with a first sequence word line. A plurality of second transistors are also included. Each of the second transistors is coupled between two columns of the memory group and is adjacent to each of the first rows. The second transistors form a plurality of second rows, wherein gate electrodes of the second transistors in the same second row are coupled to a second sequence word line.

The invention provides a non-volatile memory device. Wherein, a logic input and control unit receives a plurality of operation signals. A control unit is coupled to the logic input and control unit for controlling an operation of the non-volatile memory device. An address and command register communicates with the control unit. A high voltage unit provides various needed voltages. A memory cell array unit includes the above memory array structure. A first direction decoder and a second direction decoder are coupled with the address and command register, so as to select a memory cell of the memory cell array unit. A sensing and register unit is used to sense and register data. An I/O control and buffer unit is used for data transmission of the memory device.

A semiconductor memory layout comprises a substrate, wherein a plurality of doped regions are formed in the substrate any arranged in a two-dimensional array by rows and columns. A plurality of isolation structures in the substrate for isolating the doped regions. An oxide/nitride/oxide (ONO) layer, deposited over a block region of the substrate. A plurality of first gate electrodes are located between adjacent two of the doped regions in columns, so as to form a plurality of first transistors. A plurality of first conductive lines are respectively coupling the gate electrodes of the first transistors in rows. A plurality of second gate electrodes are located between adjacent two of the doped regions in rows, so as to form a plurality of second transistors. A plurality of second conductive lines are respectively coupling the gate electrodes of the second transistors in rows. An insulating structure layer, serving isolation function for the first conductive lines and the second conductive lines.

A non-volatile memory array structure comprises a plurality of first transistors, coupled in series to form a plurality of transistor strings in a first direction. A plurality of second transistors are coupled between adjacent two of the transistor strings, wherein at least a portion of source/drain regions of the first transistor and the second transistor are commonly used. A plurality of first word lines are respectively coupling gate electrodes of the first transistors in a second direction. A plurality of second word lines are respectively coupling gate electrodes of the second transistors in the second direction.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
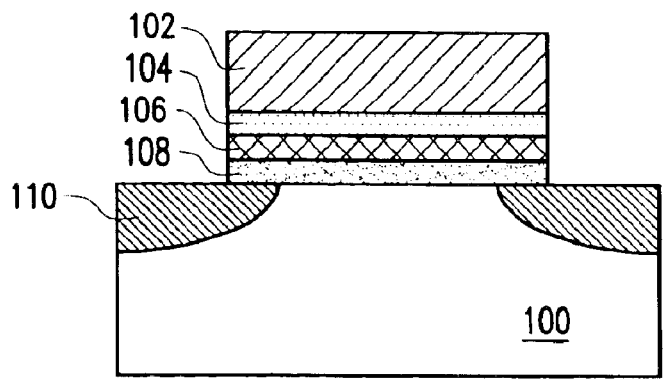
FIG. 1 is a cross-sectional drawing, schematically illustrating a conventional MOS memory cell with the ONO structure to have memory function.
Figure 2:
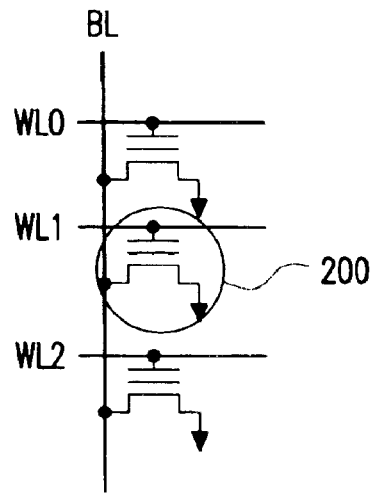
FIGS. 2–3 are circuit drawings, schematically illustrating the layouts of conventional non-volatile memory devices.
Figure 3:
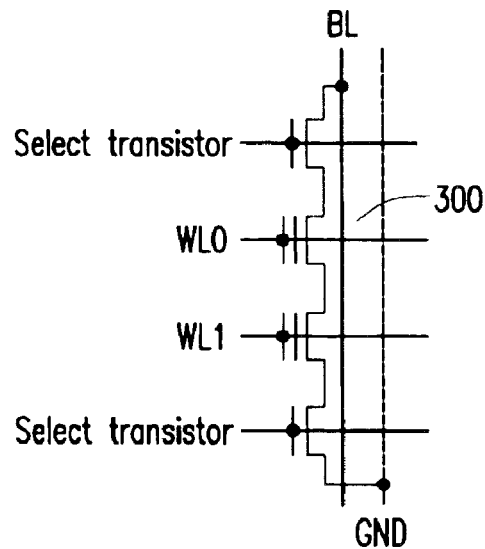

In the invention, a non-volatile memory device with vertical memory cells and horizontal cells is introduced. Here, the terms of "vertical" and "horizontal" are used to describe the invention in better clarity for two directions. However, the invention is not necessary to be restricted to the exact meaning of "vertical" and "horizontal". The memory cell can be the structure as described in FIG. 1. However, the array layout can is designed to have better compactness, in the invention.

Figure 4:
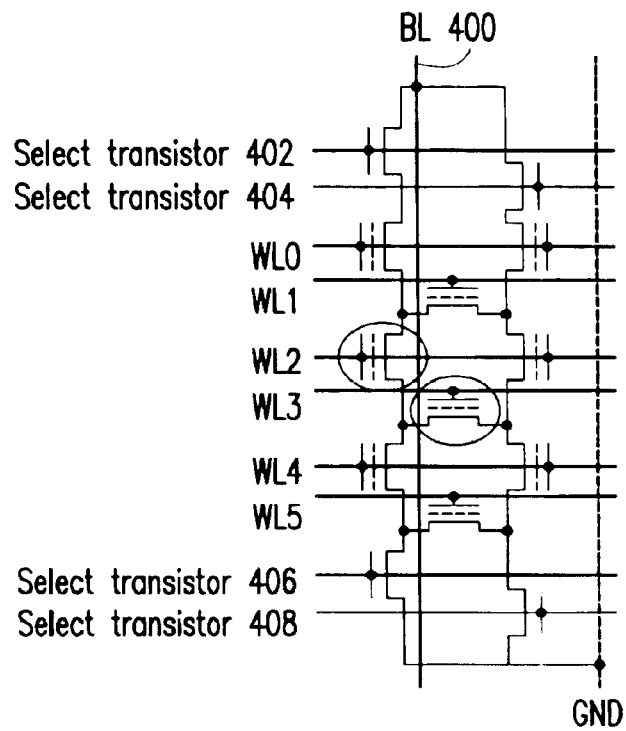
FIG. 4 is a circuit drawing, schematically illustrating a layout of non-volatile memory devices, according to a preferred embodiment of the present invention.

FIG. 4 is a circuit drawing, schematically illustrating a layout of non-volatile memory devices, according to a preferred embodiment of the present invention. In general, the array layout includes vertical cells and horizontal cells. The bit line BL 400 and source line to the ground GND are common for vertical cells. The horizontal cells are set between two vertical cell strings.

In more detail by referring to FIG. 4, several vertical transistors, serving as memory cells, are coupled in series at the source/drain regions, so as to form a vertical transistor string. In FIG. 4, only three vertical transistors are shown as an example for descriptions. Two vertical transistor strings are grouped into one memory group or, i.e., memory sector, using the same bit line 400. The gate electrodes of the vertical transistors in vertical transistor strings are coupled together by a word line. The word lines for the vertical transistors can be, for example, an even-number word lines, WL0, WL2, and WL4. The vertical transistors belonging to the same word line form a row. In addition, several horizontal transistors are formed between the two adjacent transistor strings and adjacent to the even-number word lines. The source/drain regions, that are, doped regions of the horizontal transistors are commonly used for the vertical transistor. The gate electrodes of the horizontal transistor are coupled together in row by another word lines, such as the odd-number word lines WL1, WL3, WL5. It should be noted that starting with the even sequence is a better option but is not restricted.

In order to actually produce the current path through between the two transistor columns, several switching devices, such as MOS transistors, 402, 404, 406, 408 are used. By applying the enable/disable voltage on the gate electrodes of the upper switching transistors 402, 404, one string can be selected. The path can go through the string or bypass the horizontal transistor. Then, the lower switching transistors 406, 408 are properly turned on. The operations are to be described in better detail in FIGS. 13–14 later.

Figure 5:
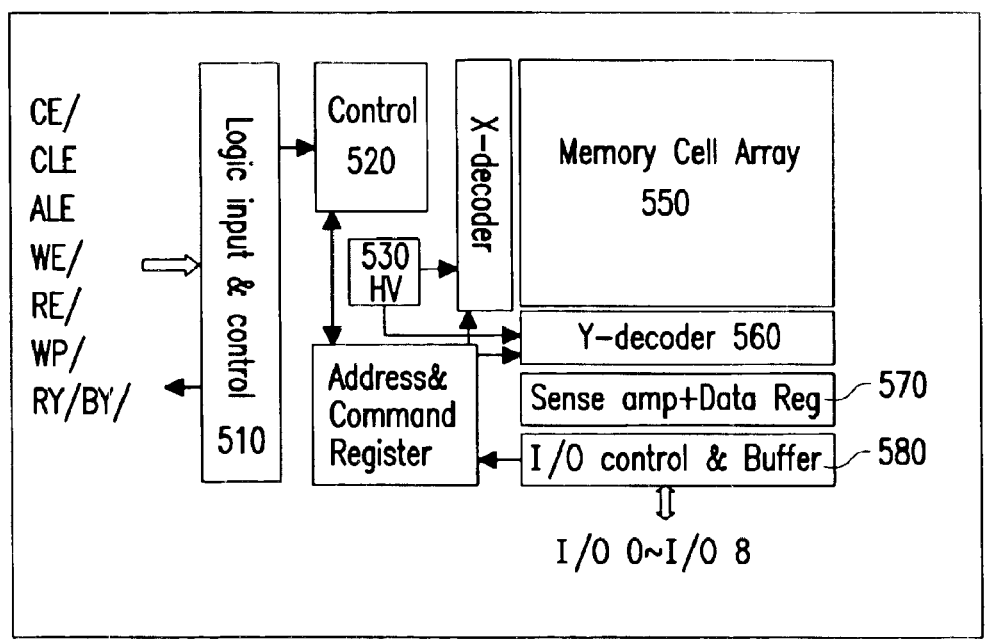
FIG. 5 is a block diagram, schematically illustrating a whole memory device using the layout of FIG. 4, according to a preferred embodiment of the present invention.
Figure 12:
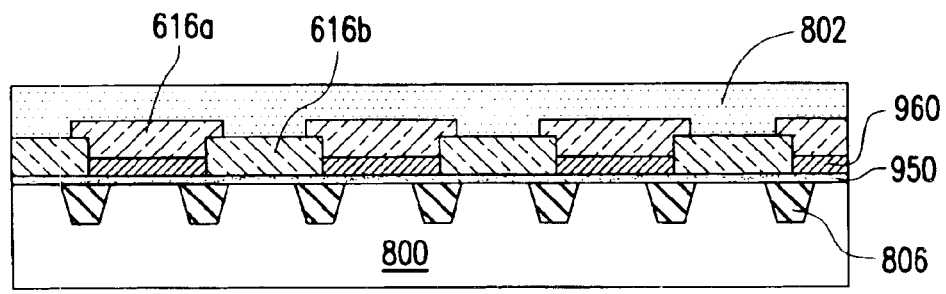
Figure 13:
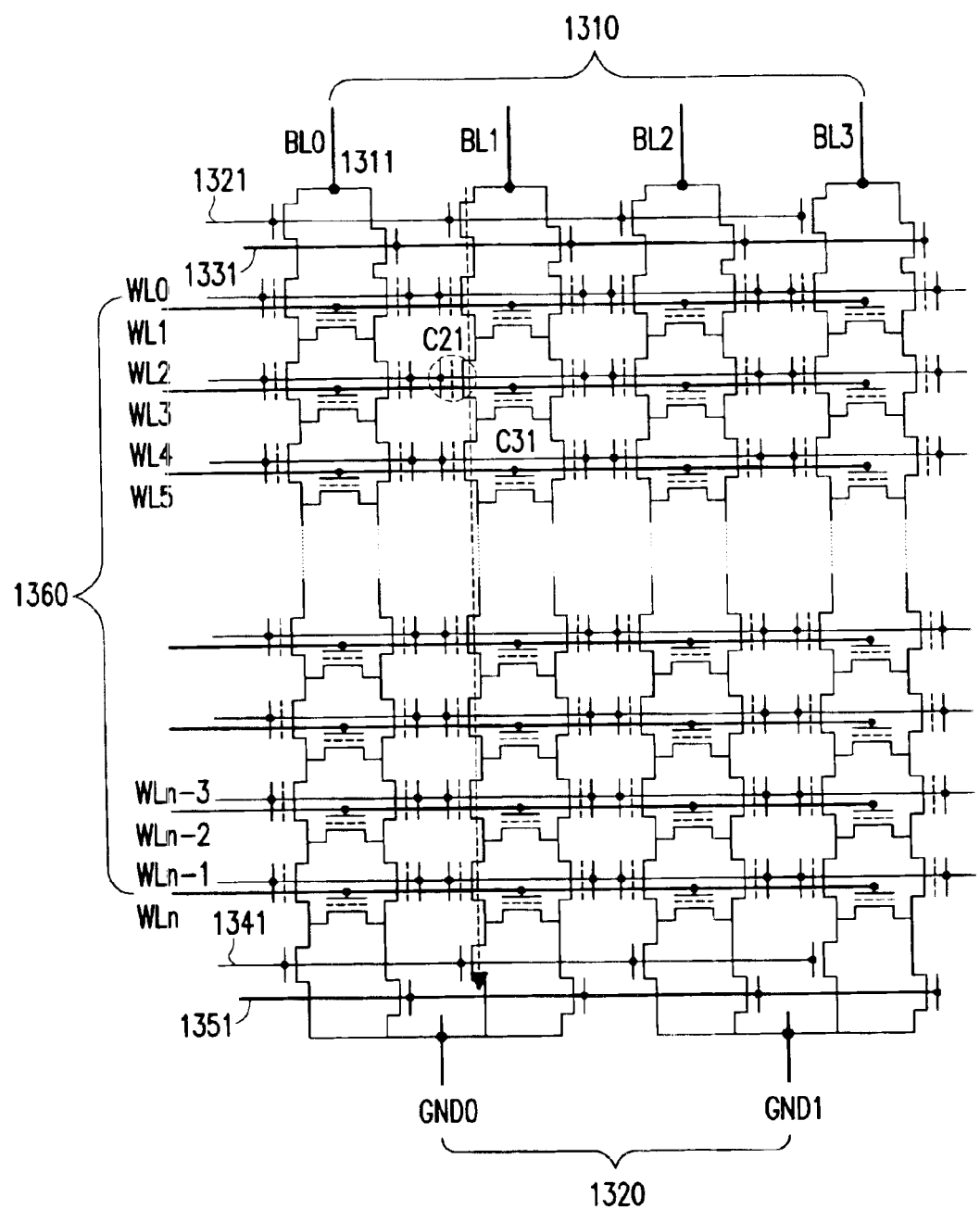
FIGS. 13–14 are circuit structure, schematically illustrating the operation mechanism for reading, programming, and erasing, according to a preferred embodiment of the present invention.
Figure 14:
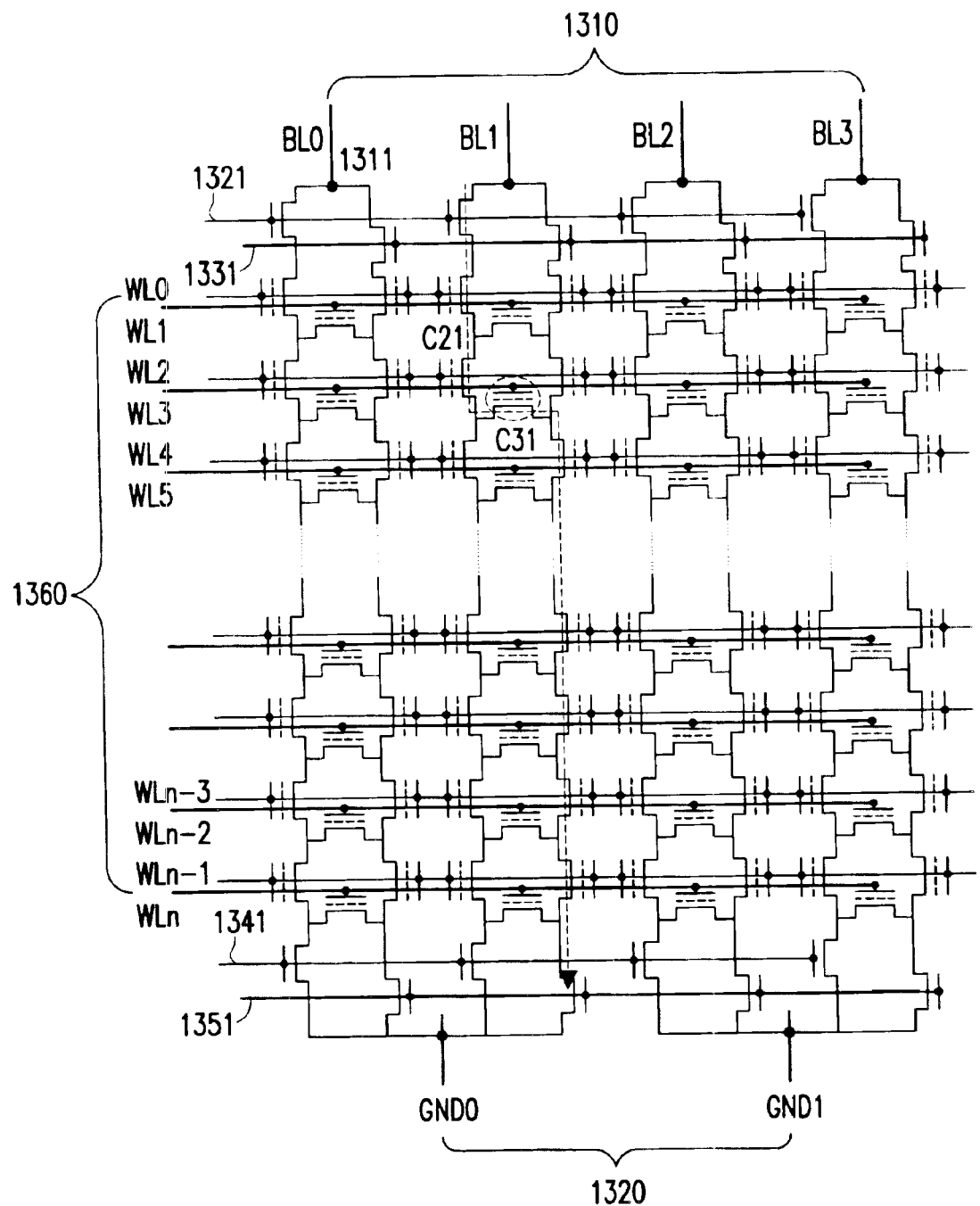

When the memory groups as shown in FIG. 4 are put together to form a memory array as shown in FIG. 13 or FIG. 14, a memory cell array can be formed and applied to a whole memory device. FIG. 5 is a block diagram, schematically illustrating a whole memory device using the layout of FIG. 4, according to a preferred embodiment of the present invention. In FIG. 5, the memory device includes a logic input and control unit 510 to receive a plurality of operation signals. A control unit 520 is coupled to the logic input and control unit 510 for controlling an operation of the non-volatile memory device. An address and command register communicates with the control unit 520. A high voltage unit 530 provides various needed voltages. A memory cell array unit 550 includes the memory array structure in FIG. 4 or FIGS. 12–13. A first direction decoder, such as X-decoder, and a second direction decoder, such as Y-decoder, are coupled with the address and command register, so as to select a memory cell of the memory cell array unit 550. A sensing and registering unit 570 is used to sense and register data. An I/O control and buffer unit 580 is used for data transmission of the memory device. In the structure of the FIG. 5, the memory cell array unit 550 has the structure as shown in FIG. 4, so that the memory device can be better compact. The other device blocks can be changed according to the actual design.

Figure 6:
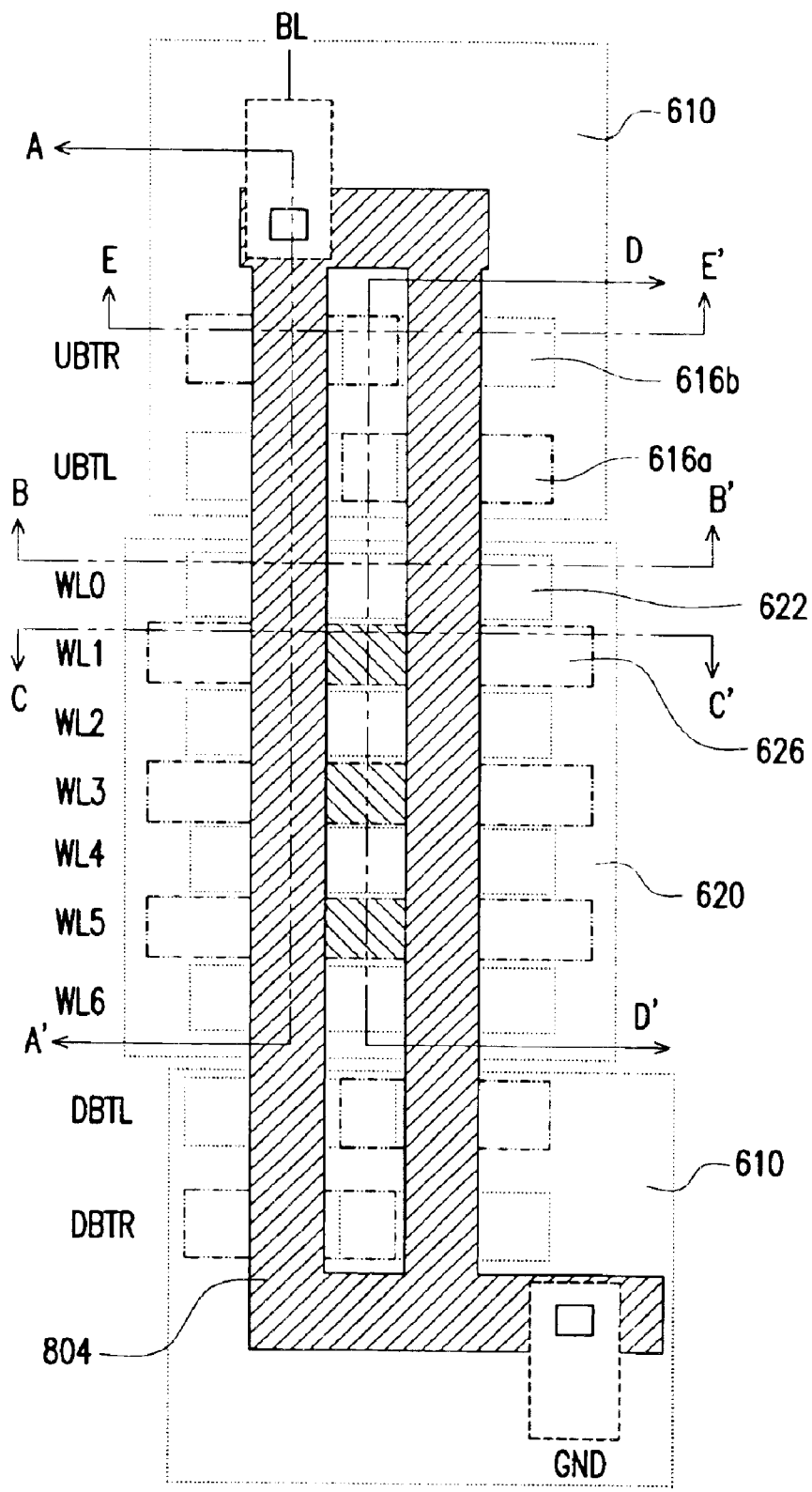
FIG. 6 is a drawing, schematically illustrating a layout of the non-volatile memory devices in semiconductor fabrication, according to a preferred embodiment of the present invention.
Figure 7:
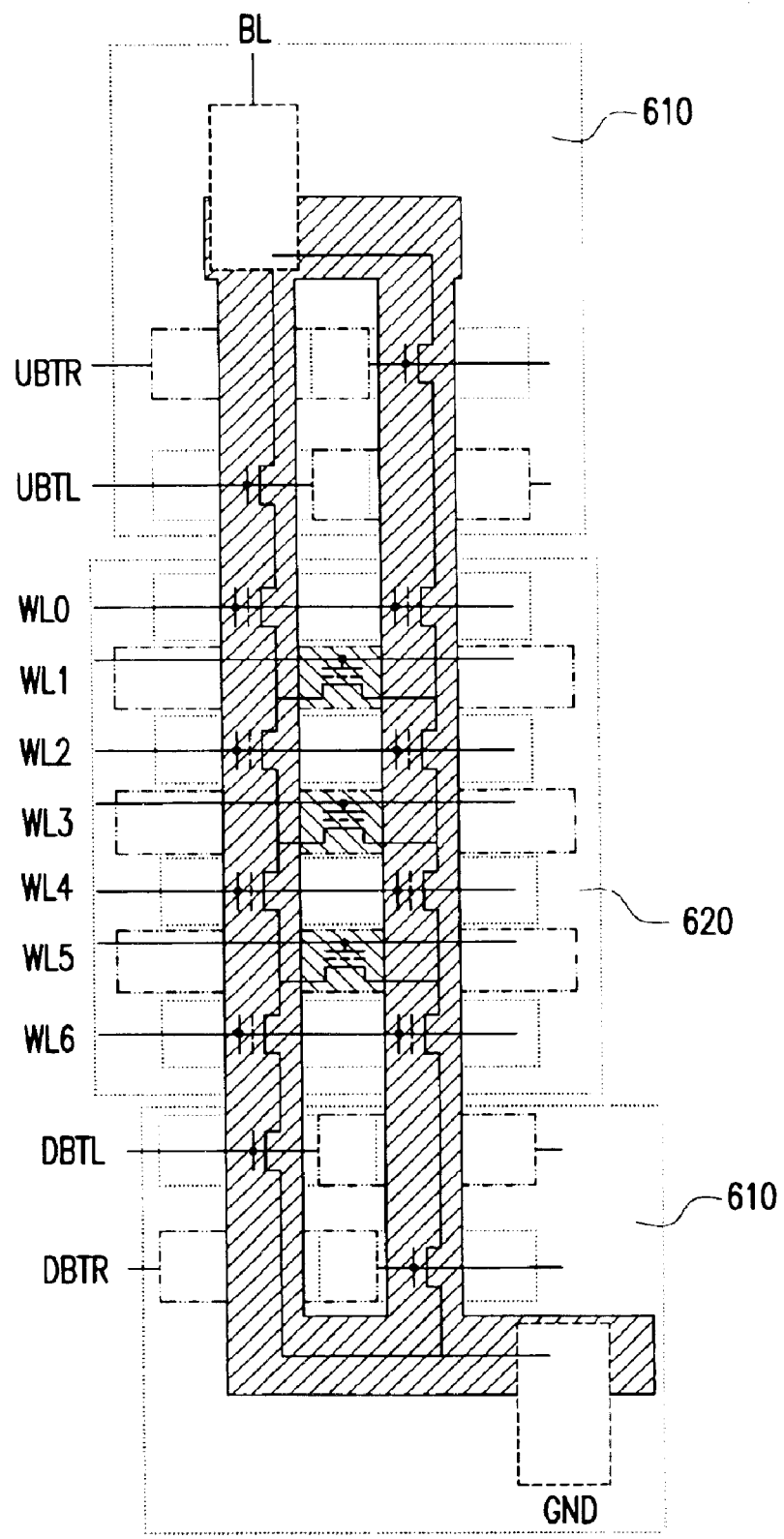
FIG. 7 is a drawing, schematically illustrating the circuit based on the layout in FIG. 6.

In order to fabricate the circuit in FIG. 4, a semiconductor structure is shown in FIGS. 6–11 as an example. FIG. 7 is a drawing, schematically illustrating the circuit based on the layout in FIG. 6. FIGS. 8–11 are cross-sectional views, schematically the semiconductor structure in AA', BB', CC', and DD' cross-sectional directions in FIG. 6. In FIG. 6, a portion of the structure over a substrate is shown. As known by the ordinary artisans, the flash memory is formed in block. Here, the substrate, in other words, can be referred as a doped well region with respect to a block used in flash memory. The memory device basically is divided into two parts 610 and 620. In the part 610, the switching transistors UBTL, UBTR, DBTL, and DBTR with the gate lines, each of which is composes of two conductive parts 616a and 616b in electric couple, wherein the conductive part 616b also serving as the gate electrode. Also in FIG. 12, the gate line for the switching transistors UBTR is taken as the example for description, the two conductive parts 616a and 616b are alternatively coupled together as a selection gate line. In order to select the left column or right column, the switching transistors UBTL, UBTR, DBTL, and DBTR are correspondingly turned on/off, as to be described later in operation mechanism. The gate oxide layer 950 is one bottom-layer of the ONO dielectric layer 620. The dielectric layer 960 is used to isolate the conductive part 616a from the gate oxide layer 950. A bit line 804 (see FIG. 8) is coupled to the source/drain region through a contact 614. The conductive line 622 is equivalent to the even-number word line, and the conductive line 626 is equivalent to the odd-number word line. Some dopes regions are formed in the substrate to serve as the source/drain regions.

Figure 8:
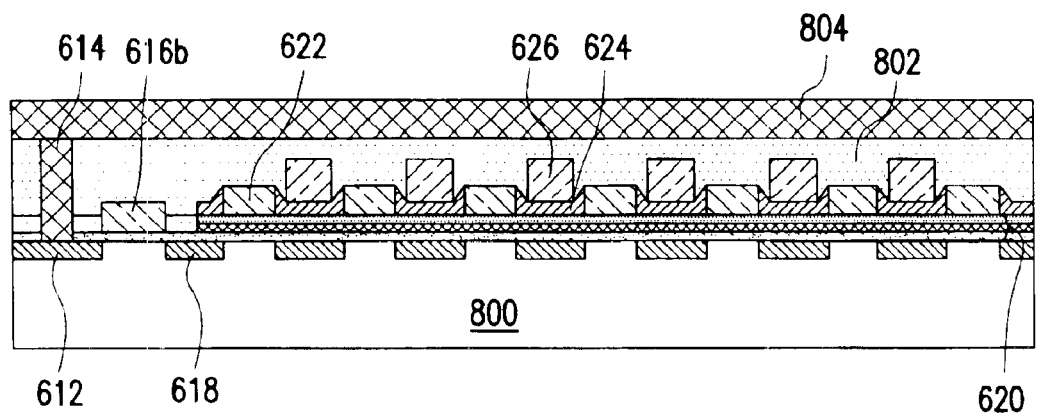
FIGS. 8–12 are cross-sectional views, schematically the semiconductor structure in various cross-sectional directions in FIG. 6, according to a preferred embodiment of the present invention.

Referring to FIGS. 6, 7, 8, the substrate 800 has several doped regions 618 arranged in columns and rows. The ONO dielectric layer 620 is formed on the substrate 800. The conductive line 622 is the even-number word line, wherein a portion of the conductive line 622 also serves as a gate electrode for the vertical transistor. The source/drain regions of the vertical transistors are commonly used. In addition, the another conductive line 626 is the odd-number word line, and located above some doped regions of the vertical transistor. The insulating structure layer 624 is located between the conductive line 626 and the ONO dielectric layer 620, above the doped regions 618. The bit line 804 and the dielectric layer 802 to insulate the device from bit line are also included. The detail should be understood by the ordinary skilled artisans, as illustrated in drawings.

Figure 9:
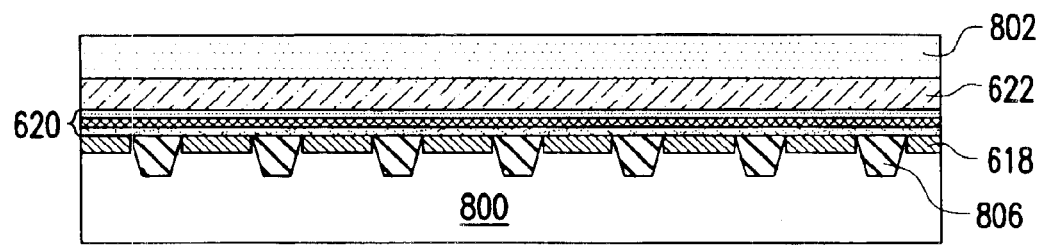

However, from the BB' direction in FIG. 9, some isolation structures 806, such as the shallow trench isolation structure, for formed between the doped regions 618. In other words, the isolation structures are used for the necessary isolation use. For example, some are located between four adjacent doped regions 618.

Figure 10:
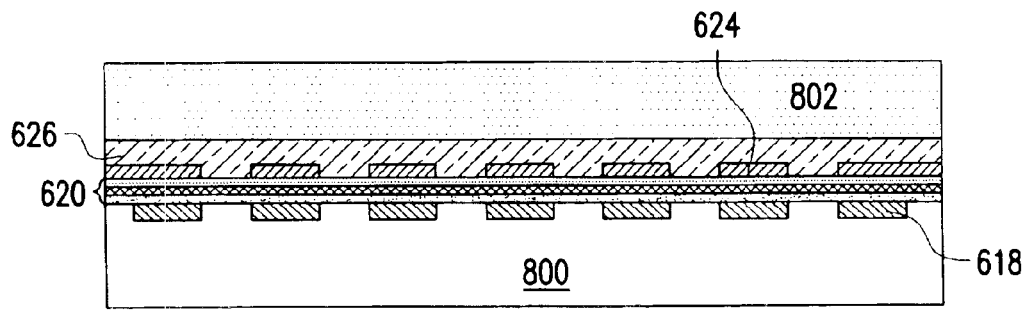

The structure for the horizontal transistor can be seen in CC' direction as shown in FIG. 10. The conductive line 626 is the odd-number word line, wherein a portion of the conductive line 626 also serves as the gate electrodes of the horizontal transistors. The portion between the insulating structure layers 624 are the gate electrodes of the horizontal transistor. The two doped regions 618 at each side of the gate electrodes are the source/drain regions. In this manner, the source/drain regions of the horizontal transistors are also commonly used. The insulating structure layers 624 with the sidewall spacer is also used to isolate the even-number word lines and the odd-number word lines.

Figure 11:
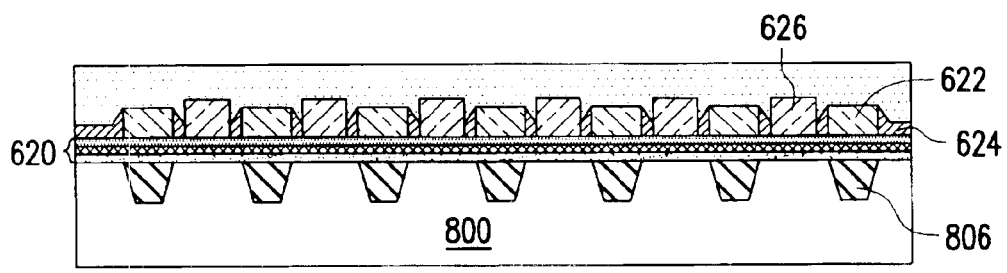

At the direction DD' as shown in FIG. 11, the isolation structure 806 is shown again. The conductive line 622 is crossing over the isolation structure 806. However, the conductive line 626 is between the isolation structure 806. In addition, there is no doped regions under the conductive lines 622 and 626.

Now, the actual circuit layout for the memory cell array and its operation mechanism are to be described by referring to FIG. 13 and FIG. 14. In FIGS. 13–14, the word lines 1360 denoted by WL0, WL1, . . . WLn. Two vertical transistor columns are grouped as a group, using the same bit line 1311, as an example, respectively denoted by BL0, BL1, BL2, BL3 . . . . Here, only four bit lines are shown. Each vertical column has an upper switching device and the down switching device. The switching device can be formed, for example, by a conventional MOS transistor with the control on the gate electrode. In order to be easy implementation for accessing, gate electrodes of all of the left switching transistors in different bit lines are coupled together by the conductive line 1321. Similarly, the conductive lines 1331, 1341, and 1351 are included.

Now, a vertical cell C21 and a horizontal cell C31 are taken as an example for describing the access operation. In FIG. 13, the vertical cell C21 is operated. For the read mode, when the binary content of the cell C21 is to be read out, the even word lines (WL0, WL2 . . . WLn=even) are decoded. Since, the cell C21 is controlled by word line WL2, the WL2 is set to a constant working voltage level (Vwl). The other deselect word lines are set to an enable voltage, such as a high level, so that the vertical transistors are conducted to work as a pass gate function. At the same time period, the horizontal cells are turned off by applying a disable voltage, such as low level, to the odd word lines WL1, WL3, . . . . As a result, the current path, as noted by the dashed line, is formed. Here, the bit line BL1 is activated, and the conductive lines 1321 and 1341 are set to high level while the other two switching transistors are disable by a low level voltage.

If cell C21 has low $V_T$, the cell C21 is turn on and output data output is high. Otherwise, if the cell C21 is at high $V_T$, the cell C21 is off and data output is low. Similarly, the other cells can be read out sequentially by the same operation mechanism.

In FIG. 14, if the horizontal cell C31 is to be read, odd word lines (WL1, WL3 . . . WLn−1) are decoded. The word line WL3 is selected and is set to a constant voltage level (Vwl). The other deselect word lines are set to a low voltage level, so as to turn off the other horizontal cells. At this read time period, the vertical cells are turn on to operate as pass gate cells, wherein the even word lines WL0, WL2, . . . are biased at high voltage level. In this situation, one of upper switching transistors is turned on and one of the lower switching transistor in different column of the same memory group is turned on while the other two switching transistors are turn off. In this manner, one possible current path is denoted by the dashed line. Alternatively, it is still working that the conductive lines 1331 and 1341 are set to high level, and the conductive lines 1321 and 1351 are set to low level. In this manner, the current path is opposite to the dashed line.

If the cell C31 is at low $V_T$, the cell C31 is on and the outputting data is high. Otherwise, if the cell C31 is at high $V_T$, then the cell is off and the outputting data is low. The others cell can be read by the similar way.

For the programming mode, referring to FIG. 13, the cell C21 is to be programmed. In this situation, the bit line BL1 is selected. All vertical cells are decoded by even word lines (WL0, WL2 . . . WLn=even). The word line WL2 is selected and set to a programming voltage, such as a very high constant voltage level (Vph). The other deselected even word lines are kept at a constant high level, which is to turn on the transistor as a pass gate. At this programming time period, the horizontal cells are turned off by applying the odd word lines with a low voltage level. And, the column in the bit line BL1 is selected to be the left column by setting the conductive lines 1321 to the enable voltage, such as high level, while the other conductive lines 1331, 1341, 1351 are set to the disable voltage, such as a low level.

If the cell C21 wants to be programmed to high $V_T$, the input data will be low, the bit line level is kept at low level within some program period. The cell C21 is then programmed to high $V_T$. The cell C21 data can be read out at low level state in the verify or read mode operation. Otherwise, the cell C21 is programmed to high, in which the input data is high and the bit line level is kept at high level. In this situation, the cell C21 can not be programmed, and the cell $V_T$ remains at the same level. After then, the cell C21 data can be verified by reading a high level state. Similarly, the other cell can be programmed properly select by the same principle.

For the case to program horizontal cell C31 in FIG. 14, the all horizontal cells are decoded by odd word lines (WL1, WL3 . . . WLn−1). When data is to be programmed into the cell unit C31, the word line WL3 is selected and kept at a voltage level, such as a very high constant voltage level (Vph). The other deselect word lines are kept at a low voltage level. At this time period, the horizontal cells are operated as pass gate cells, wherein the even word lines are biased to a high voltage level. The UBTL with respect to conductive line 1321 is, for example, selected and kept at high voltage level, while the other switching transistors DBTL,UBTR and DBTR with respect the conductive lines 1331, 1341, and 1351 are kept at low level.

If the cell C31 wants to be programmed to high $V_T$, the input data is low, and the bit line BL1 level is kept at low level during the program period. The cell C31 is then programmed to high $V_T$ by F-N mechanism, and is verified from the read mode. Otherwise, if the cell C31 wants to be programmed to data high, the input data is high level, wherein the bit line level is kept at high level. As a result, the cell C31 can not be programmed, and the cell $V_T$ is kept at original level. The cell C31 data is read out for verification. Similarly, the other horizontal cell can be programmed by the same principle.

For the erasing mode, since the memory array was composed by block unit, the vertical cells and the horizontal cells are erased to low $V_T$ simultaneously in the same block. All of the word lines (even and odd word line) are biased to a constant low level, while the block p-type well is biased to very high level (Vbwell). And then, after some erase period, all the cells in the decoded block are erased to low VT. Each cell data is read out for verification. The other blocks also would be erased to low $V_T$ by sequentially block unit decoded.

The present invention has introduced the memory cell array, which includes vertical memory cells and horizontal cells. As a result, the memory array can at least be more compact.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A non-volatile memory array structure, comprising:
   a plurality of first transistors, serving for memory function, arranged to have a plurality of columns and a plurality of first rows, wherein the first transistors in each column are coupled in series at source/drain regions, and adjacent two of the columns are grouped into a memory group using a common bit line, and gate electrodes of the first transistors in the same first row are coupled with a first sequence word line; and
   a plurality of second transistors, serving for memory function, wherein each of the second transistors, in commonly used source/drain regions, is coupled between two columns of the memory group and is adjacent to each of the first rows, so that the second transistors form a plurality of second rows, wherein gate electrodes of the second transistors in the same second row are coupled to a second sequence word line.

2. The non-volatile memory array structure of claim 1, wherein the first sequence word line is an even number word line and the second sequence word line is an odd number word line.

3. The non-volatile memory array structure of claim 1, wherein the first sequence word line intervenes with the second sequence word line.

4. The non-volatile memory array structure of claim 1, each column of the memory group further comprises an upper switching unit coupled between the bit line and the column, and a lower switching unit coupled between the bit line and a ground terminal, so that the switching units associated with the bit lines and the word lines is used to selected a desired flow path in the memory group.

5. The non-volatile memory array structure of claim 4, wherein each of the switching units includes a MOS transistor.

6. An accessing operation method for the non-volatile memory device as recited in claim 4, comprising performing a reading operation to read a content stored in a selected first transistor of the first transistors, wherein the reading operation comprising:
   selecting a bit line with respect to the selected memory group;
   setting a corresponding one of the first sequence word line, which has the selected first transistor, by a constant voltage;
   setting the other first sequence word lines by an enable voltage to conduct the first transistors;
   setting the second sequence word line by a disable voltage to isolate the second transistors; and
   switching-on the upper switching unit and the lower switching unit for the same column having the selected first transistor, and switching-off the other switching units in the selected memory group.

7. The accessing operation method of claim 6, wherein the enable voltage is a high-level voltage and the disable voltage is a low-level voltage.

8. The accessing operation method of claim 6, further comprising performing a reading operation to read a content stored in a selected second transistor of the second transistors, the reading operation comprising:
   selecting a bit line with respect to the selected memory group;
   setting a corresponding one of the second sequence word line, which has the selected second transistor, by a constant voltage;
   setting the other second sequence word lines by a disable voltage to isolate the second transistors;
   setting the first sequence word line by an enable voltage to conduct the first transistors; and switching-on one of the upper switching units and one of the lower switching units in different columns, and switching off the other switching units in the selected memory group.

9. The accessing operation method of claim 8, wherein the enable voltage is a high-level voltage and the disable voltage is a low-level voltage.

10. An accessing operation method for the non-volatile memory device as recited in claim 4, comprising performing a programming operation to write a content into a selected first transistor of the first transistors, wherein the programming operation comprising:

selecting a bit line with respect to the selected memory group, wherein the selected bit line is at a voltage used in writing;

setting a corresponding one of the first sequence word line, which has the selected first transistor, by a writing constant voltage;

setting the other first sequence word lines by an enable voltage to conduct the first transistors;

setting the second sequence word line by a disable voltage to isolate the second transistors; and switching-on one of the upper switching units for a writing period while switching-off the other switching units in the selected memory group.

11. The accessing operation method of claim 10, wherein the enable voltage is a high-level voltage and the disable voltage is a low-level voltage.

12. The accessing operation method of claim 10, wherein the voltage used in writing for the bit line is a low-level voltage or a high-level voltage, and the writing constant voltage is a very high constant voltage.

13. The accessing operation method of claim 10, further comprising performing a programming operation to write a content into a selected second transistor of the second transistors, wherein the programming operation comprising:

selecting a bit line with respect to the selected memory group, wherein the selected bit line is at a voltage used in writing;

setting a corresponding one of the second sequence word line, which has the selected second transistor, by a writing constant voltage;

setting the other second sequence word lines by a disable voltage to isolate the second transistors;

setting the first sequence word line by an enable voltage to conduct the first transistors; and switching-on one of the upper switching units for a writing period while switching-off the other switching units in the selected memory group.

14. The accessing operation method of claim 13, wherein the enable voltage is a high-level voltage and the disable voltage is a low-level voltage.

15. The accessing operation method of claim 13, wherein the voltage used in writing for the bit line is a low-level voltage or a high-level voltage, and the writing constant voltage is a very high constant voltage.

16. An accessing operation method for the non-volatile memory device as recited in claim 4, comprising performing an erasing operation to erase contents stored in a memory block unit, wherein the erasing operation comprising:

applying an erasing voltage to all the word lines belonging to the memory block; and applying a substrate erasing voltage on the memory block unit for an erasing period, wherein the contents of the memory block are erased.

17. A non-volatile memory device, comprising:

a logic input and control unit, receiving a plurality of operation signals;

a control unit, coupled to the logic input and control unit for controlling an operation of the non-volatile memory device;

an address and command register, communicating with the control unit;

a high voltage unit to provide various needed voltages;

a memory cell array unit, which includes the memory array structure of claim 1;

a first direction decoder;

a second direction decoder, wherein the two decoders are coupled with the address and command register, so as to select a memory cell of the memory cell array unit;

a sensing and registering unit to sense and register data; and an I/O control and buffer unit, used for data transmission of the memory device.

18. A semiconductor memory layout, comprising:

a substrate, wherein a plurality of doped regions are formed in the substrate arranged in a two-dimensional array by rows and columns;

a plurality of isolation structures in the substrate for isolating the doped regions;

an oxide/nitride/oxide (ONO) layer, deposited over a block region of the substrate;

a plurality of first gate electrodes, located between adjacent two of the doped regions in columns, so as to form a plurality of first transistors;

a plurality of first conductive lines, respectively coupling the gate electrodes of the first transistors in rows;

a plurality of second gate electrodes, located between adjacent two of the doped regions in rows, so as to form a plurality of second transistors;

a plurality of second conductive lines, respectively coupling the gate electrodes of the second transistors in rows; and an insulating structure layer, serving isolation function for the first conductive lines and the second conductive lines.

19. The semiconductor memory layout of claim 18, wherein the first conductive lines are even-number word lines and the second conductive lines are odd-number word lines.

20. The semiconductor memory layout of claim 18, wherein the first conductive lines are odd-number word lines and the second conductive lines are even-number word lines.

21. A non-volatile memory array structure, comprising:

a plurality of first transistors, coupled in series to form a plurality of transistor strings in a first direction;

a plurality of second transistors, coupled between adjacent two of the transistor strings, wherein at least a portion of source/drain regions of the first transistor and the second transistor are commonly used;

a plurality of first word lines, respectively coupling gate electrodes of the first transistors in a second direction; and a plurality of second word lines, respectively coupling gate electrodes of the second transistors in the second direction.

* * * * *